United States Patent
Chiu

(10) Patent No.: US 7,133,655 B2
(45) Date of Patent: Nov. 7, 2006

(54) AMPLIFIERS AND AMPLIFYING METHODS FOR USE IN TELECOMMUNICATIONS DEVICES

(75) Inventor: Janice Chiu, Tustin, CA (US)

(73) Assignee: Broadcom Corporation, Irvine, CA (US)

( * ) Notice: Subject to any disclaimer, the term of this patent is extended or adjusted under 35 U.S.C. 154(b) by 406 days.

(21) Appl. No.: 10/806,140

(22) Filed: Mar. 23, 2004

(65) Prior Publication Data

US 2005/0215220 A1 Sep. 29, 2005

(51) Int. Cl.
*H04B 17/00* (2006.01)

(52) U.S. Cl. .................. 455/226.4; 455/67.11; 455/115.3; 455/226.2; 455/127.3; 455/253.2

(58) Field of Classification Search ............ 455/226.4, 455/226.1–226.2, 115.1, 115.3–115.4, 127.2–127.3, 455/232.1, 500, 513, 63.1, 67.7, 67.11, 91, 455/137–138, 134, 308, 311, 144, 194.2, 455/241.1, 245.1, 251.1, 253.2, 277.2, 341; 330/140, 279, 133–134; 327/560; 375/317–318

See application file for complete search history.

(56) References Cited

U.S. PATENT DOCUMENTS

| 4,578,820 | A | * | 3/1986 | Highton | 455/226.2 |
| 4,591,805 | A | * | 5/1986 | Highton | 330/294 |
| 4,620,114 | A | * | 10/1986 | Moon | 327/58 |
| 4,680,553 | A | * | 7/1987 | Kimura et al. | 330/2 |
| 5,390,365 | A | * | 2/1995 | Enoki et al. | 455/553.1 |
| 5,689,814 | A | * | 11/1997 | Hagisawa et al. | 455/69 |
| 5,722,062 | A | * | 2/1998 | Nakanishi et al. | 455/247.1 |
| 5,839,060 | A | * | 11/1998 | Kasperkovitz et al. | 455/226.2 |
| 5,873,046 | A | * | 2/1999 | Bronner | 455/553.1 |
| 5,875,390 | A | * | 2/1999 | Brehmer et al. | 455/226.2 |
| 5,999,803 | A | * | 12/1999 | Kim | 455/226.2 |
| 6,058,292 | A | * | 5/2000 | Terreault | 455/78 |
| 6,122,495 | A | * | 9/2000 | Chiang et al. | 455/226.2 |
| 6,195,399 | B1 | * | 2/2001 | Dent et al. | 375/322 |
| 6,259,901 | B1 | * | 7/2001 | Shinomiya et al. | 455/127.3 |
| 6,313,704 | B1 | * | 11/2001 | Maruyama et al. | 330/259 |
| 6,420,934 | B1 | * | 7/2002 | Butler et al. | 330/279 |
| 6,731,918 | B1 | * | 5/2004 | Kaneki | 455/226.1 |
| 6,753,735 | B1 | * | 6/2004 | Arai et al. | 330/297 |
| 6,859,098 | B1 | * | 2/2005 | Husseini | 330/133 |
| 7,054,598 | B1 | * | 5/2006 | Bae | 455/127.2 |
| 2002/0039038 | A1 | * | 4/2002 | Miyazawa | 327/113 |
| 2002/0149418 | A1 | * | 10/2002 | Allott et al. | 327/560 |
| 2006/0046677 | A1 | * | 3/2006 | Nakano | 455/226.2 |

* cited by examiner

*Primary Examiner*—Pablo N. Tran
(74) *Attorney, Agent, or Firm*—Squire, Sanders & Dempsey L.L.P.

(57) ABSTRACT

A signal strength indicator circuit that includes a first amplifier configured to receive a first input signal from a first mixer and a second input signal from a second mixer;. The circuit also includes a second amplifier configured to receive a first set of differential inputs from the first amplifier. The circuit further includes a third amplifier configured to receive a second set of differential inputs from the second amplifier stage. Even further, the circuit includes an output port for emitting an output signal that is a rectified combination of the first input signal and the second input signal. Also, a method of processing signals input into a signal strength indicator circuit.

21 Claims, 4 Drawing Sheets

AMPLIFIERS AND AMPLIFYING METHODS FOR USE IN TELECOMMUNICATIONS DEVICES

BACKGROUND OF THE INVENTION

1. Field of the Invention

Certain embodiments of the present invention are directed generally to amplifiers that may be included in electronic circuits that are commonly used in telecommunications devices. Certain other embodiments of the present invention are directed generally at methods of operating telecommunications devices with such amplifiers.

2. Description of the Related Art

Amplifiers are electronic components that are commonly included in a variety of electronic circuits, some of which are included in currently-available telecommunications devices. For example, amplifiers are often included in Received Signal Strength Indicator (RSSI) and/or Transmitted Signal Strength Indicator (TSSI) circuits, where amplification of signals received by a telecommunications device is desired and/or required for proper operation of the device.

In currently-available telecommunications devices, once a Radio Frequency (RF) signal has been received, for example, from another device, the RF signal is typically amplified to ensure that the signal is of sufficient strength to be processed by the receiving device. Then, the Alternating Current (AC) component of the received RF signal is typically down-converted from RF to an Intermediate Frequency (IF) that may more easily be processed. This down-conversion is commonly performed using an IQ mixer.

Once the frequency of the AC component of the received signal has been down-converted, the AC component is forwarded to the above-mentioned RSSI and/or TSSI circuits from the IQ mixer as two separate signals: an I signal, and a Q signal, which is 90° out-of-phase with the I signal. In order to accommodate these separate signals, currently-available RSSI and TSSI circuits provide separate paths for each. In other words, once input into a currently-available RSSI or TSSI circuit, the I and the Q signal are separately amplified, rectified, and otherwise processed.

One substantial disadvantage of providing separate paths for each signal that is input into a signal strength indicator circuit is that the separate components in each path make the circuit larger. Hence, if the circuit is included on a chip in a telecommunication device, the circuit covers a large area on the chip, leaving less area for other devices to be included on the chip.

Another substantial disadvantage of providing separate paths is that, since twice as many electronic components are needed to form two paths than one, the circuit with two paths requires a relatively large amount of power to operate. In addition, this additional power consumption often requires more complex cooling. Hence, at least in view of the above, currently-available signal strength indicator circuits are less than ideal for inclusion in telecommunications devices.

SUMMARY OF THE INVENTION

According to certain embodiments of the present invention, a signal strength indicator circuit is provided. This circuit includes a first amplifier stage for receiving a first input signal from a first mixer and a second input signal from a second mixer. This circuit also includes a second amplifier stage for receiving a first set of differential inputs from the first amplifier stage. In addition, this circuit includes a third amplifier stage for receiving a second set of differential inputs from the second amplifier stage. Further, this circuit includes an output port for emitting an output signal that is a rectified combination of the first input signal and the second input signal.

According to certain other embodiments of the present invention, a method of processing signals input into a signal strength indicator circuit is provided. The method includes a first receiving step, wherein a first input signal is received from a first mixer and a second input signal is received from a second mixer in a first amplifier. The method also includes a forwarding step, wherein a first set of differential inputs are forwarded from the first amplifier to a second amplifier, and wherein a second set of differential inputs are forwarded from the second amplifier to a third amplifier. The method further includes an emitting step, wherein an output signal that is a rectified combination of the first input signal and the second input signal is emitted from the circuit.

According to yet other embodiments of the present invention, a signal strength indicator circuit is provided. This circuit includes a first amplifying means for receiving a first input signal from a first mixer and a second input signal from a second mixer. This circuit also includes a second amplifying means for receiving a first set of differential inputs from the first amplifying means. In addition, this circuit includes a third amplifying means for receiving a second set of differential inputs from the second amplifying means. Further, this circuit includes an emitting means for emitting an output signal that is a rectified combination of the first input signal and the second input signal.

BRIEF DESCRIPTION OF THE DRAWINGS

For a proper understanding of the invention, reference should be made to the accompanying drawings, wherein.

DETAILED DESCRIPTION OF THE PREFERRED EMBODIMENTS

Figure 1:
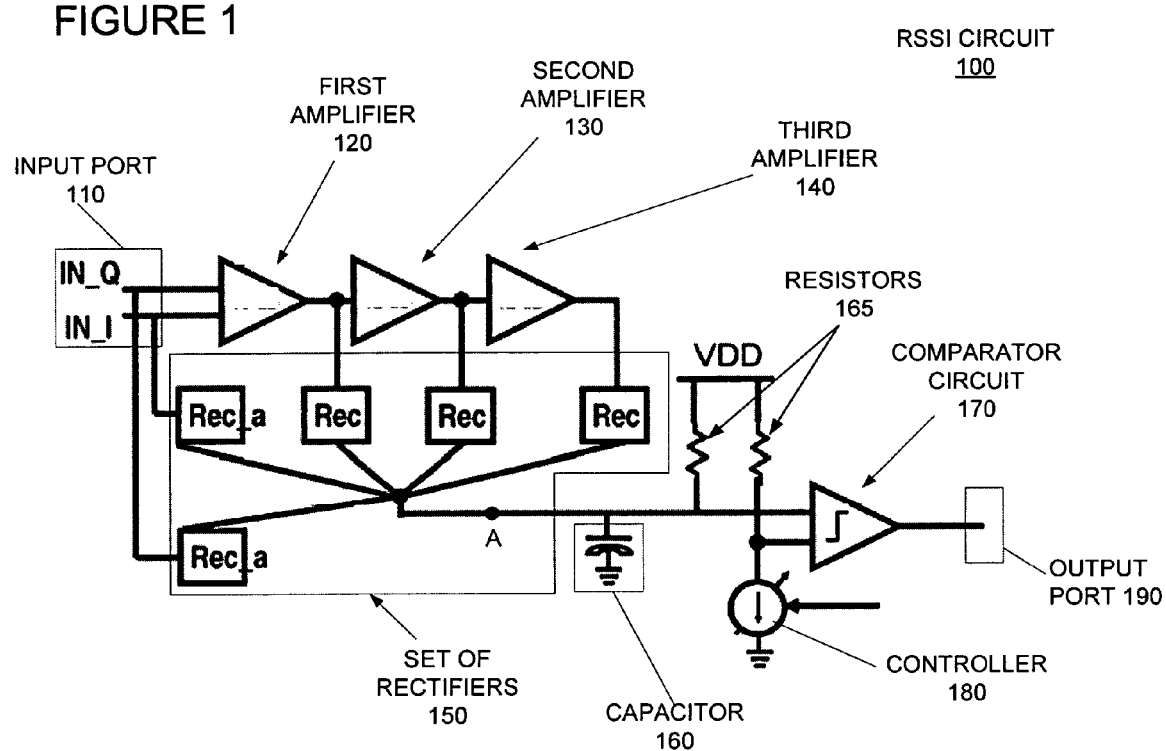
FIG. 1 illustrates a schematic representation of a signal strength indicator circuit that includes three stages of amplifiers.

FIG. 1 illustrates a schematic representation of a Received Signal Strength Indicator (RSSI) circuit 100 that may be included in telecommunications devices according to certain embodiments of the present invention. In operation, circuit 100 receives signals through input port 110. The signals received at input port 110 are typically AC components of RF signals received by a telecommunication device that includes circuit 100.

Usually, before reaching input port 110, an AC component has been amplified by an amplifier outside of circuit 100 such as, for example, a Low-Noise Amplifier (LNA) that is operably connected to input port 110. After amplification, the AC component is typically mixed down to an Intermediate Frequency (IF) by a mixer operably connected between the outside amplifier and input port 110.

As illustrated in FIG. 1, circuit 100 may receive both a Q input signal (IN_Q) and an I input signal (IN_I) from an IQ mixer that may be operably connected to input port 110. Generally, the Q input signal and the I input signal are 90° out-of-phase with each other.

Input port 110 is operably connected to first amplifier 120, which typically receives both the I input signal and the Q input signal. Then, first amplifier 120 generally combines the information contained in these two received signals and forwards a single combined signal to second amplifier 130, to which first amplifier 120 is operably connected. Second amplifier 130 may then forward a single signal to third amplifier 140, to which second amplifier 130 is operably connected. As illustrated in FIG. 1, a portion of the combined signal from first amplifier 120 may also be forwarded to one or more rectifiers in set of rectifiers 150, as may a portion of the signal from second amplifier 130 and third amplifier 140.

By allowing first amplifier 120 to receive and combine the information in the Q input signal and the I input signal, a single path is provided, as opposed to the separate paths of signal strength indicator circuits according to the related are. Thus, circuit 100 greatly reduces the amount of physical area covered by circuit 100, which in turn allows for circuit 100 to be cooled more easily, and also allows for circuit 100 to utilize less power than signal strength indicator circuits wherein the I input signal and the Q input signal are provided separate paths.

In addition to the above-described components, circuit 100 includes capacitor 160, which is, along with resistors 165, part of a resistor-capacitor (RC) filter that filters the signal output from set of rectifiers 150. This filtered and rectified output signal is more linear than, and is inversely proportional to, either of the input signals at input port 110 of circuit 100.

Circuit 100 also includes two resistors 165 that are operably connected between set of rectifiers 150 and the power supply (VDD) of circuit 100. The use of resistors 165 to connect to VDD provides additional stability to circuit 100, reducing and/or eliminating the influence of power supply voltage fluctuations on the signal output by the rectifiers in set of rectifiers 150.

Also included in circuit 100 is comparator circuit 170, which is operably connected to set of rectifiers 150, controller 180, and output port 190. Once the above-discussed I and Q input signals have been combined and processed by amplifiers 120, 130, 140 and set of rectifiers 150, a signal is typically forwarded to comparator circuit 170. Comparator circuit 170 then compares the signal it receives with one or more threshold values stored in comparator circuit 170.

If, for example, the signal it receives exceeds a first threshold value, comparator circuit 170 may determine that the I and Q input signals are too weak to be processed by circuit 100 without losing information. On the other hand, if the received signal is below a second threshold value, comparator circuit 170 may determine that the I and Q input signals are too strong to be processed by circuit 100 without causing circuit saturation. However, if the received signal is between the above-discussed first and second threshold values, comparator circuit 170 may determine that the I and Q input signals are in a range voltage and/or current range that allows for circuit 100 to operate properly.

When the I and Q signals have been determined to be either too strong or too weak, comparator circuit 170 forwards a signal to output port 190. This signal ultimately causes the gain of the outside amplifier that led to the I and Q input signals being forwarded for the above-discussed IQ mixer to input port 110 to be switched. On the other hand, if the I and Q input signals are in a range that allows circuit 100 to operate properly, comparator circuit 170 may either forward a signal through output port 190 confirming that no amplifier gain changes need to be made or may not forward any signal at all. In other words, output port 190 may function as a digital signal indicator that may be used to cause an outside amplifier to switch between a low gain and a high gain setting, if such a switch is desirable for operation of circuit 100.

Controller 180 is typically used to set and/or modify the threshold values stored in comparator circuit 170. Controller 180 may also be used to adjust other variables related to comparator circuit 170.

In FIG. 1, it should be noted that, although only single amplifiers 120, 130, 140 are illustrated, each of these amplifiers may be substituted with additional circuitry that provides for a stage of amplification. It should also be noted that, according to certain embodiments of the present invention, first amplifier 120 may be set to provide 15 dB of amplification, while second and third amplifiers 130, 140 may be set to each provide 12 dB of amplification.

If desired, first amplifier 120 may be configured to provide a gain that is at least 3 dB higher than the gain from second amplifier 130 and/or the gain from third amplifier 140. Such additional gain from first amplifier 120 relative to second and third amplifiers 130, 140 may be used compensate for the fact that, in FIG. 1, first amplifier 120 receives the first input signal and the second input signal, which are 90° out of phase with each other, individually from each of an I mixer and a Q mixer. In contrast, the second amplifier 130 and the third amplifier 140 each receive signals that are combinations of the first input signal and the second input signal.

Figure 2:
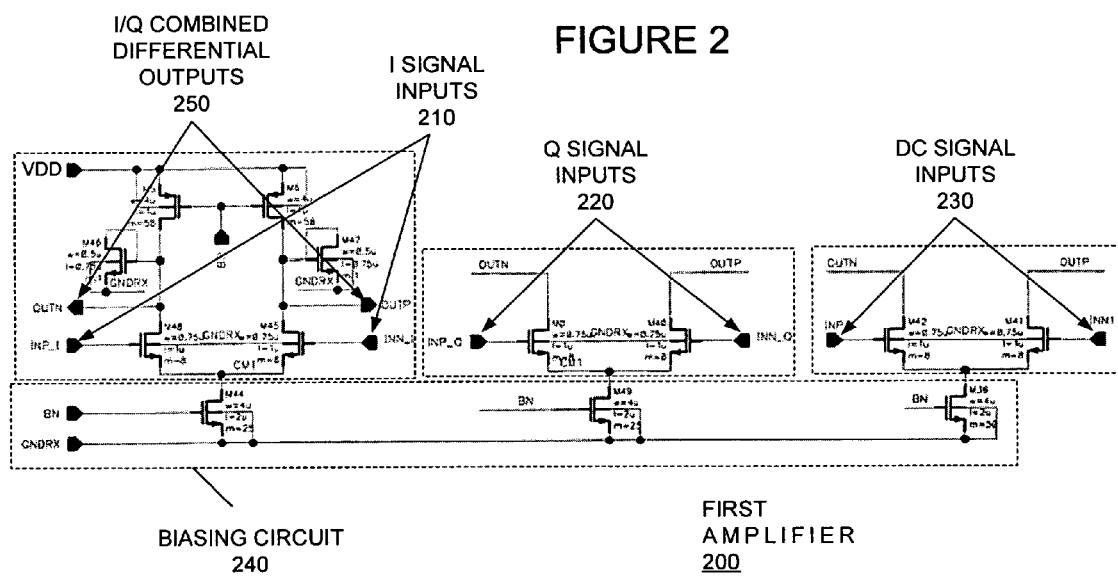
FIG. 2 illustrates a schematic representation of a first stage amplifier that may be included in the circuit illustrated in FIG. 1.

FIG. 2 illustrates a schematic representation of a representative first amplifier 200 that may, for example, be included in RSSI circuit 100 illustrated in FIG. 1 as first amplifier 120. In FIG. 2, I signal inputs 210, Q signal inputs 220, and DC signal inputs 230 are illustrated, as are I/Q combined differential outputs 250. I signal inputs 210 are typically configured to receive an above-discussed I input signal, Q signal inputs 220 are typically configured to receive an above-discussed Q input signal, and DC signal inputs 230 are typically configured to receive signals from a DC offset cancellation loop that may also be operably connected to first amplifier 200. Also included in FIG. 2 is biasing circuit 240, which provides tail current for the sub-sections that receive the I input signal, Q input signal, and DC offset cancellation loop signals, respectively.

It should be noted that the above-mentioned DC offset cancellation loop is typically an RC-type filter which connects the DC signal inputs 230 in the first amplifier 120 in FIG. 1 and the signal output of the third amplifier 140 in FIG. 1. The DC cancellation loop will generally compensate/cancel the DC offset introduced at the input of the first amplifier 120, which propagates and may be amplified through the second and third amplifiers 130, 140. More specifically, the DC offset cancellation loop may be used to ensure that all three amplifiers 120, 130, and 140 in FIG. 1 operate at proper operating levels and that these amplifiers will not be saturated.

Figure 3:
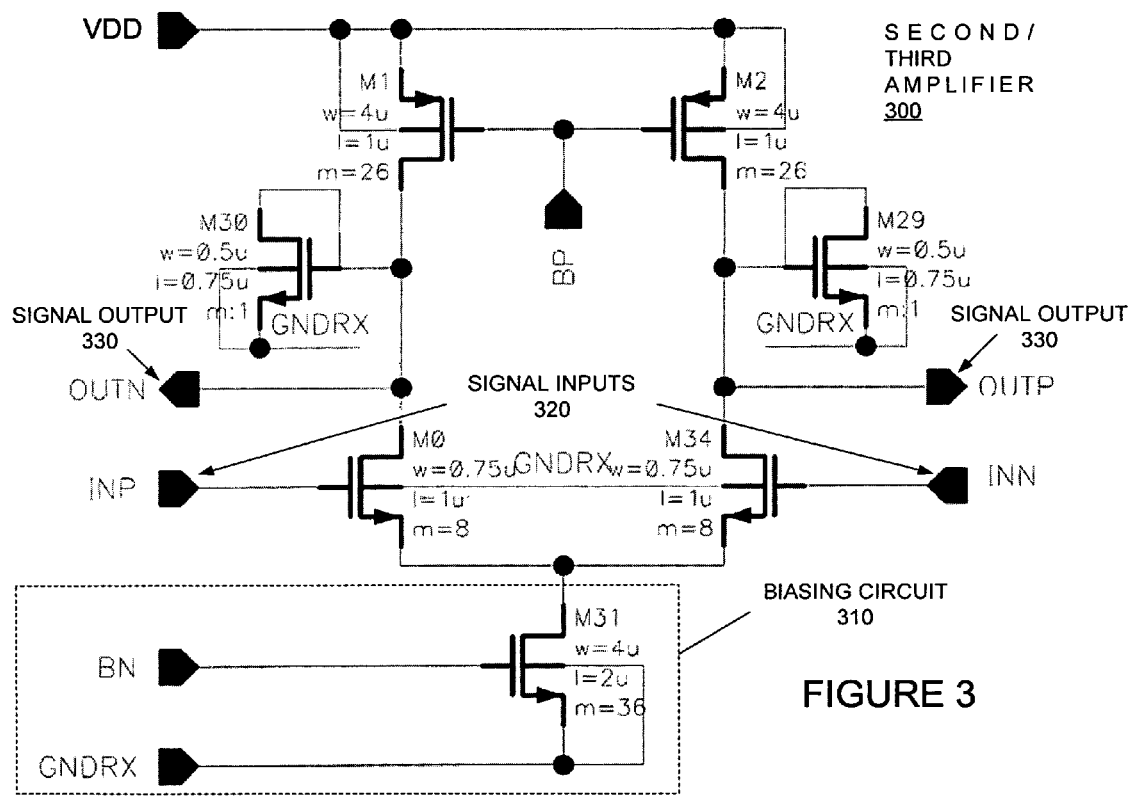
FIG. 3 illustrates a schematic representation of a second and/or third stage amplifier that may be included in the circuit illustrated in FIG. 1.

FIG. 3 illustrates a schematic representation of a second amplifier 300 that may be included, for example, in RSSI circuit 100 illustrated in FIG. 1. Most commonly, second amplifier 300, would be used as second amplifier 130 and/or third amplifier 140 in FIG. 1, since, as discussed above, both amplifiers 130 and 140 typically each provide a substantially similar amount of amplification, and since each typically receives a set of differential inputs, as opposed to the separate inputs that first amplifier 120 receives through input port 110.

As with first amplifier 200 illustrated in FIG. 2, second amplifier 300 includes a biasing circuit 310. In FIG. 3, signal outputs 330 are illustrated as operably connected to differential signal inputs 320 and electronic components that amplify an input signal entering second amplifier 300 through inputs 320. Signal outputs 330 may also be operably connected to one or more rectifiers, such as a rectifier in set of rectifiers 150 illustrated in FIG. 1. Signal outputs 330 may also be operably connected to amplifiers such as, but not limited to third amplifier 140.

Both first amplifier 200 and second amplifier 300 are illustrated as being operably connected to power supply voltage (VDD). Such connection to VDD helps to stabilize signals output from amplifiers 200 and 300 over time by allowing for fluctuations in power supply voltage over time to be compensated for.

Figure 4:
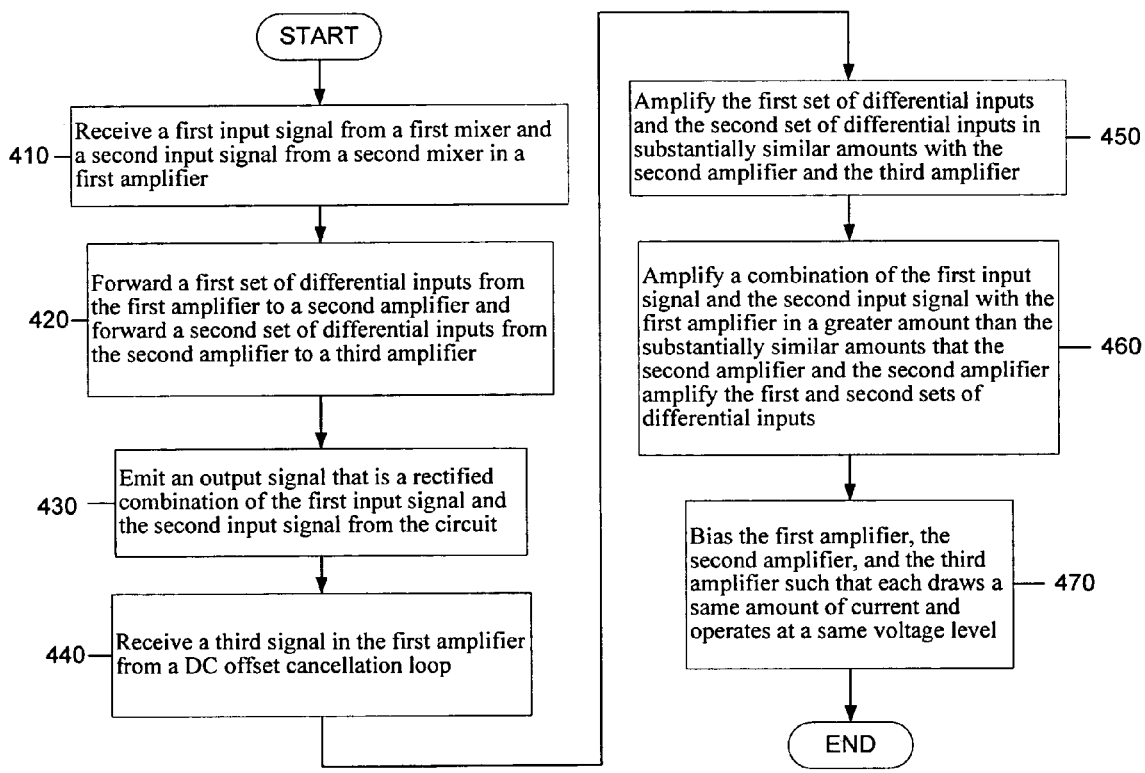
FIG. 4 illustrates a flowchart that includes the steps of a method of processing a signal received by a signal strength indicator circuit according to certain embodiments of the present invention.

FIG. 4 illustrates a flowchart 400 that includes the steps of processing a signal received by a signal strength indicator circuit according to certain embodiments of the present invention. This method may be used in conjunction with any of the circuits, components, and/or devices described herein, as well as with any other circuits, components, and/or devices that one skilled in the art of the present invention may wish.

Step 410 includes receiving a first input signal from a first mixer and a second input signal from a second mixer in a first amplifier. With reference to FIG. 1, step 410 includes receiving IN_Q and IN_I in first amplifier 120.

Step 420 includes forwarding a first set of differential inputs from the first amplifier to a second amplifier and forwarding a second set of differential inputs from the second amplifier to a third amplifier. Amplifiers 120, 130, 140 in FIG. 1 illustrate one possible amplifier configuration that facilitates step 420.

Step 430 includes emitting an output signal that is a rectified combination of the first input signal and the second input signal from the circuit. According to step 430 the rectified combination may include all information contained in the first input signal and the second input signal. In FIG. 1, set of rectifiers 150 may be configured so as to perform step 430. According to certain embodiment of the present invention, set of rectifiers 150 is configured such that an output signal output from the set of rectifiers 150, for example, at Node A in FIG. 1, is inversely proportional to an input signal input from input port 110.

Step 440 includes receiving a third signal in the first amplifier from a DC offset cancellation loop. Such as DC offset cancellation loop was discussed above and illustrated in FIG. 2.

Step 450 includes amplifying the first set of differential inputs and the second set of differential inputs in substantially similar amounts with the second amplifier and the third amplifier. To implement this step, as discussed above, second amplifier 130 and third amplifier 140 may each be configured to provide 12 dB of amplification.

Step 460 includes amplifying a combination of the first input signal and the second input signal with the first amplifier in a greater amount than the substantially similar amounts that the second amplifier and the second amplifier amplify the first and second sets of differential inputs. To implement step 460, first amplifier 120 may, for example, be configured to provide 15 dB of amplification, while second amplifier 130 and third amplifier 140 may each be configured to provide 12 dB of amplification.

Step 470 includes biasing the first amplifier, the second amplifier, and the third amplifier such that each draws a same amount of current and operates at a same voltage level.

If either some or all of the above-listed steps, or modifications thereof that will become apparent to those skilled in the art when practicing the present invention, are performed, processing of input signals will be possible by using signal strength indicator circuits that take up relatively small areas, that are relatively easily cooled, and/or that use relatively little power. Such steps may be used for operating telecommunications devices or any other devices in which circuits and/or amplifiers such as those described above may be included.

One having ordinary skill in the art will readily understand that the invention, as discussed above, may be practiced with steps in a different order, and/or with hardware elements in configurations which are different than those which are disclosed. Therefore, although the invention has been described based upon certain preferred embodiments, it would be apparent to those of skill in the art that certain modifications, variations, and alternative constructions would be appropriate, while remaining within the spirit and scope of the invention. In order to determine the metes and bounds of the invention, therefore, reference should be made to the appended claims.

I claim:

1. A signal strength indicator circuit, comprising:
   a first amplifier stage for receiving a first input signal from a first mixer and a second input signal from a second mixer;
   a second amplifier stage for receiving a first set of differential inputs from the first amplifier stage;
   a third amplifier stage for receiving a second set of differential inputs from the second amplifier stage; and
   an output port for emitting an output signal that is a rectified combination of the first input signal and the second input signal, wherein the first amplifier stage provides a higher gain than either of the second amplifier stage and the third amplifier stage so as to compensate for receiving the first input signal and the second input signal individually.

2. The circuit of claim 1, wherein the first amplifier stage is also for receiving a third signal from a DC offset cancellation loop.

3. The circuit of claim 1, wherein the second amplifier stage and the third amplifier stage each provide a substantially the same amount of amplification.

4. The circuit of claim 1, wherein the first amplifier stage provides a higher amount of amplification than each of the second amplifier stage and the third amplifier stage provide individually.

5. The circuit of claim 1, wherein the second amplifier stage and the third amplifier stage each receive signals that are combinations of the first input signal and the second input signal.

6. The circuit of claim 5, wherein the first amplifier stage provides a first gain that is at least 3 dB higher than either a second gain from the second amplifier stage and a third gain from the third amplifier stage.

7. The circuit of claim 1, wherein the first amplifier stage, the second amplifier stage, and the third amplifier stage are each biased to draw a same amount of current and to operate at a same voltage level.

8. A method of processing signals input into a signal strength indicator circuit, the method comprising:

a first receiving step wherein a first input signal is received from a first mixer and a second input signal is received from a second mixer in a first amplifier;

a forwarding step wherein a first set of differential inputs are forwarded from the first amplifier to a second amplifier and wherein a second set of differential inputs are forwarded from the second amplifier to a third amplifier; and an emitting step wherein an output signal that is a rectified combination of the first input signal and the second input signal is emitted from the circuit; and a second amplifying step providing a higher gain of a combination of the first input signal and the second input signal at the first amplifier than the second amplifier.

9. The method of claim 8, further comprising a second receiving step wherein a third signal is received in the first amplifier from a DC offset cancellation loop.

10. The method of claim 8, further comprising a first amplifying step wherein the second amplifier and the third amplifier amplify the first set of differential inputs and the second set of differential inputs in substantially the same amounts.

11. The method of claim 10, further comprising: amplifying the first and second sets of differential inputs at the second amplifier.

12. The method of claim 8, further comprising the step of biasing the first amplifier, the second amplifier, and the third amplifier such that each draws a same amount of current and operates at a same voltage level.

13. The method of claim 8, wherein the emitting step comprises the rectified combination includes all information contained in the first input signal and the second input signal.

14. The method of claim 8, wherein the emitting step comprises sending the second input signal to a comparator and emitting an output indicator to cause gain switching in an amplifier.

15. A signal strength indicator circuit, comprising:
a first amplifying means for receiving a first input signal from a first mixer and a second input signal from a second mixer;

a second amplifying means for receiving a first set of differential inputs from the first amplifying means;

a third amplifying means for receiving a second set of differential inputs from the second amplifying means; and an emitting means for emitting an output signal that is a rectified combination of the first input signal and the second input signal, wherein the first amplifying means provides a higher gain than either of the second amplifying means and the third amplifying means so as to compensate for receiving the first input signal and the second input signal individually.

16. The circuit of claim 15, wherein the first amplifier stage is also configured to receive a third signal from a DC offset cancellation loop.

17. The circuit of claim 15 wherein the second amplifying means and the third amplifying means each provide a substantially the same amount of amplification.

18. The circuit of claim 15, wherein the first amplifying means provides a higher amount of amplification than each of the second amplifying means and the third amplifying means provide individually.

19. The circuit of claim 15, wherein the second amplifying means and the third amplifying means each receive signals that are combinations of the first input signal and the second input signal.

20. The circuit of claim 19, wherein the first amplifying means provides a first gain that is at least 3 dB higher than either a second gain from the second amplifying means and a third gain from the third amplifying means.

21. The circuit of claim 15, wherein the first amplifying means, the second amplifying means, and the third amplifying means are each biased to draw the same amount of current and the same voltage level.

* * * * *